(12) United States Patent
Kim et al.

(10) Patent No.: US 6,930,630 B1
(45) Date of Patent: Aug. 16, 2005

(54) ANALOG-TO-DIGITAL CONVERTER

(75) Inventors: Se-Jun Kim, Kyoungki-do (KR);
Sang-Hoon Hong, Kyoungki-do (KR);
Jae-Bum Ko, Kyoungki-do (KR)

(73) Assignee: Hynix Semiconductor Inc., (KR)

( * ) Notice: Subject to any disclaimer, the term of this patent is extended or adjusted under 35 U.S.C. 154(b) by 0 days.

(21) Appl. No.: 11/021,963

(22) Filed: Dec. 23, 2004

(30) Foreign Application Priority Data

Feb. 19, 2004 (KR) .................. 10-2004-0011134

(51) Int. Cl.[7] .............................................. H03M 1/12
(52) U.S. Cl. ..................................... 341/155; 341/143
(58) Field of Search ...................... 341/118, 120, 136, 341/143, 155, 158

(56) References Cited

U.S. PATENT DOCUMENTS

| | | | |
|---|---|---|---|
| 5,329,281 A * | 7/1994 | Baumgartner et al. | 341/139 |
| 5,880,691 A * | 3/1999 | Fossum et al. | 341/162 |
| 6,002,335 A * | 12/1999 | Zarembo et al. | 340/572.1 |
| 6,285,311 B1 * | 9/2001 | Lewicki | 341/172 |
| 6,448,840 B2 * | 9/2002 | Kao et al. | 327/534 |
| 6,552,676 B1 * | 4/2003 | Bjorksten et al. | 341/143 |
| 6,593,870 B2 * | 7/2003 | Dummermuth et al. | 341/155 |
| 6,759,904 B2 * | 7/2004 | Behzad | 330/254 |
| 2003/0006920 A1 * | 1/2003 | Mori | 341/118 |

* cited by examiner

Primary Examiner—Don Le
Assistant Examiner—Linh V Nguyen
(74) Attorney, Agent, or Firm—Blakely Sokoloff Taylor & Zafman

(57) ABSTRACT

An analog-to-digital converter outputs a reliable digital value corresponding to an input analog value without regard to variation of process, temperature and driving voltage. The analog-to-digital converter includes a voltage comparator for comparing an input voltage with a comparison voltage, a binary up/down counter for up/down converting an outputted binary digital code based on the comparison result of the voltage comparator, a digital-to-analog converting unit for converting the binary digital code that is transferred from the up/down counter as the comparison voltage by using a bias voltage and an offset voltage and for outputting a feedback upper threshold voltage and a feedback lower threshold voltage, and a feedback bias unit for comparing the feedback upper threshold voltage with an upper threshold voltage having the maximum level of the input voltage to output the bias voltage and comparing the feedback lower threshold voltage with a lower threshold voltage having the minimum level of the input voltage to output the offset voltage.

20 Claims, 8 Drawing Sheets

ANALOG-TO-DIGITAL CONVERTER

FIELD OF INVENTION

The present invention relates to a semiconductor integrated circuit; and, more particularly, to an analog-to-digital converter in a semiconductor integrated circuit.

DESCRIPTION OF PRIOR ART

An analog-to-digital converter for converting an analog value to a digital value is a necessity in a semiconductor integrated circuit that should convert data to digital data for processing.

There are various kinds of the analog-to-digital converter for converting the analog value to the digital value, such as a dual-slope analog-to-digital converter, a tracking analog-to-digital converter, a flash analog-to-digital converter, a sigma-delta analog-to-digital converter and the like.

Among them, the tracking analog-to-digital converter facilitates very high resolution with small circuit area and small current consumption but has a shortcoming of so low bandwidth.

FIG. 1 is a block diagram showing a conventional analog-to-digital converter.

Referring to FIG. 1, in the operation of the conventional analog-to-digital converter, a voltage comparator 21 of the conventional analog-to-digital converter compares an input voltage Vt with a comparison voltage Vin. Subsequently, a binary up/down counter 22 counts up or down a binary digital signal having 8 bits depending on the comparison result from the voltage comparator 21. The binary up/down counter 22 includes a register for storing a digital value corresponding to an initial analog value to count up or down the 8-bit binary digital signal depending on the voltage level from the voltage comparator 21.

Then, a code converting unit 25 converts upper 6 bits of the binary digital signal from the binary up/down counter 22 to a thermometer code to output to a segment digital-to-analog converting unit 27. On the other hand, a delay delays the remaining lower 2 bits of the binary digital signal to output to a binary digital-to-analog converting unit 28, by the time for which the code converting unit 25 converts the code.

The reason why the upper 6 bits of the binary digital signal from the binary up/down counter 22 are converted to the thermometer code to output to the segment digital-to-analog converting unit 27 is to reduce glitch that can be generated if the binary digital signal is directly outputted to the digital-to-analog converting unit 27 without converting.

However, because circuit area will be increased too much if all the 8 bits of the binary digital signal from the binary up/down counter 22 are converted to the thermometer code, only the upper 6 bits of the binary digital signal are converted to the thermometer code to output to the segment digital-to-analog converting unit 27.

The following Table 1 shows an example of the thermometer code. As shown, the thermometer code decodes the binary digital signal and outputs a number of high level signals corresponding to weightings. When the thermometer code decoded digital signal is converted to the analog signal, the glitch of the signal, which can be generated in converting operation, may be significantly reduced.

TABLE 1

| Binary | | | Thermometer code | | | | | | |
| --- | --- | --- | --- | --- | --- | --- | --- | --- | --- |
| D3 | D2 | D1 | T7 | T6 | T5 | T4 | T3 | T2 | T1 |
| 0 | 0 | 0 | 0 | 0 | 0 | 0 | 0 | 0 | 0 |
| 0 | 0 | 1 | 0 | 0 | 0 | 0 | 0 | 0 | 1 |
| 0 | 1 | 0 | 0 | 0 | 0 | 0 | 0 | 1 | 1 |
| 0 | 1 | 1 | 0 | 0 | 0 | 0 | 1 | 1 | 1 |
| 1 | 0 | 0 | 0 | 0 | 0 | 1 | 1 | 1 | 1 |
| 1 | 0 | 1 | 0 | 0 | 1 | 1 | 1 | 1 | 1 |
| 1 | 1 | 0 | 0 | 1 | 1 | 1 | 1 | 1 | 1 |
| 1 | 1 | 1 | 1 | 1 | 1 | 1 | 1 | 1 | 1 |

Continuously, the segment digital-to-analog converting unit 27 outputs a first analog signal Va corresponding to the thermometer code digital signal and the binary digital-to-analog converting unit 28 converts the binary digital signal outputted from the delay 26 to a second analog signal Vb.

Then, a digital-to-analog converter (DAC) load 29 combines the first and second analog signals Va, Vb from the segment digital-to-analog converting unit 27 and the binary digital analog converting unit 28 to output as one analog signal. Here, the outputted analog signal is buffered by an operational amplifier 24 to output the comparison voltage Vin.

On the other hand, a conversion controlling unit 23 controls enable states of the voltage comparator 21 and the binary up/down counter 22 in response to an inputted enable control signal T_enable. The conversion controlling unit 23 controls the analog-to-digital converter 20 to operate only if an analog value is to be converted to a digital value. Though the analog-to-digital converter 20 in FIG. 1 outputs 8-bit digital signal corresponding to the input voltage Vt having an analog value, the number of bits of the digital value can be adjusted depending on circuit construction.

Here, the converted digital value may be used in any other circuit for its purpose. For example, if the input voltage Vt is a voltage for which temperature is sensed during the operation, refresh period for the semiconductor memory device may be adjusted by using the converted digital value.

When the memory device has various periods for the refresh operation depending on temperature, current consumption in the refresh operation can be significantly reduced, for which the temperature sensing voltage is converted to the digital value and the period of the refresh operation is determined by using the converted digital value.

For this, the input voltage corresponding to the sensed temperature should be accurately converted to the digital value.

However, the input voltage can be varied according to the driving voltage of the semiconductor device. Further, the voltage level of the input voltage can be varied due to variation of semiconductor device manufacturing process.

Therefore, even though the input voltage is accurately converted to the digital value in the analog-to-digital converter shown in FIG. 1, the converted digital value could not reflect the sensed analog value exactly.

In the above example for adjusting the period of the refresh operation by sensing operation temperature, the input voltage could be inputted in various levels and, accordingly, the refresh period could be adjusted by the various converted digital values, which leads unnecessary current consumption.

SUMMARY OF INVENTION

It is, therefore, an object of the present invention to provide an analog-to-digital converter capable of outputting a reliable digital value corresponding to an input analog value without regard to variation of process, temperature and driving voltage.

In accordance with an aspect of the present invention, there is provided an analog-to-digital converter for use in a semiconductor device, including a voltage comparator for comparing an input voltage with a comparison voltage, a binary up/down counter for up/down converting an outputted binary digital code based on the comparison result of the voltage comparator, a digital-to-analog converting unit for converting the binary digital code that is transferred from the up/down counter as the comparison voltage by using a bias voltage and an offset voltage and for outputting a feedback upper threshold voltage and a feedback lower threshold voltage, and a feedback bias unit for comparing the feedback upper threshold voltage with an upper threshold voltage having the maximum level of the input voltage to output the bias voltage and comparing the feedback lower threshold voltage with a lower threshold voltage having the minimum level of the input voltage to output the offset voltage.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, an analog-to-digital converter for use in a semiconductor device in accordance with the present invention will be described in detail referring to the accompanying drawings.

Figure 1:
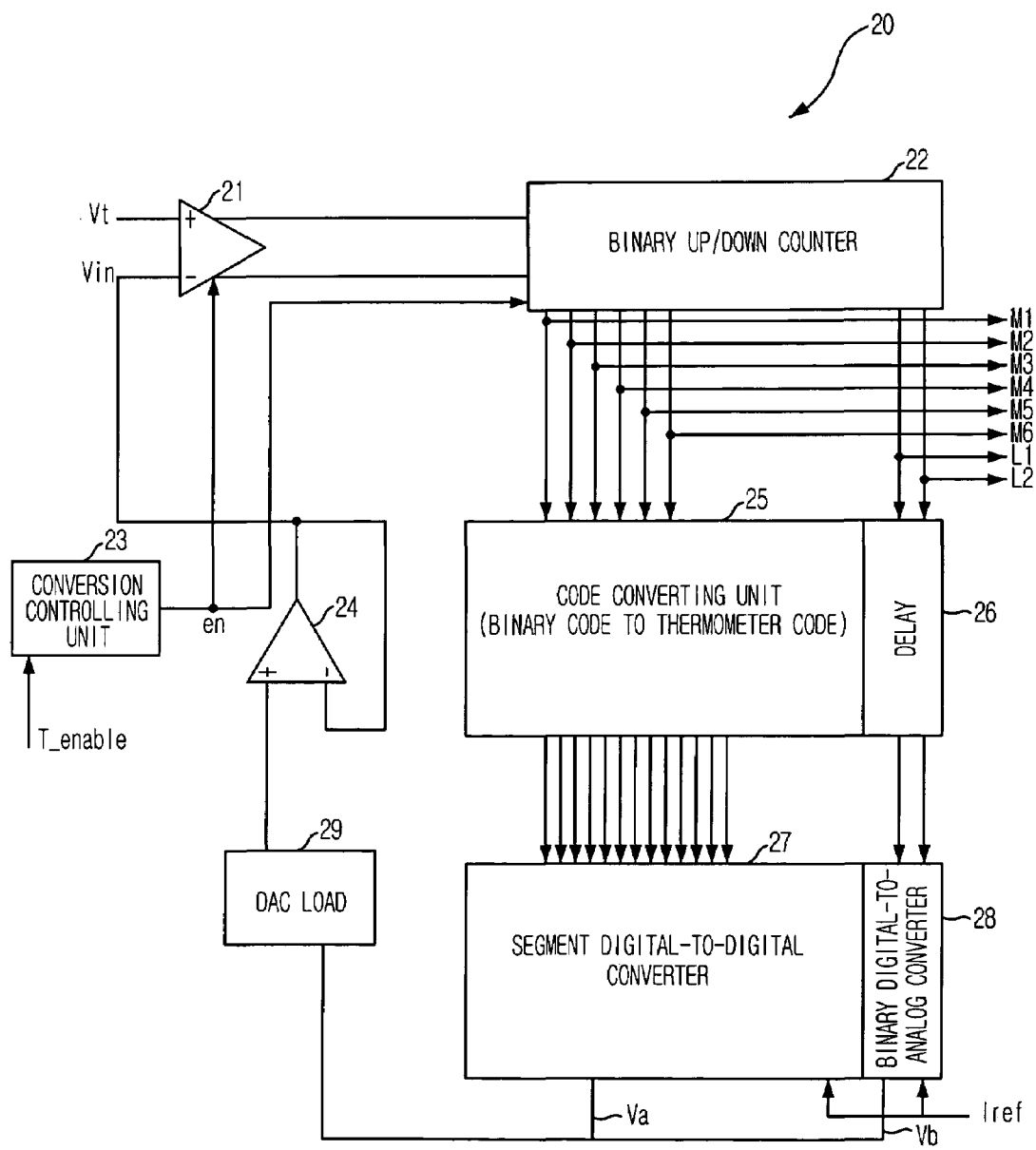
FIG. 1 is a block diagram showing a conventional analog-to-digital converter.
Figure 2:
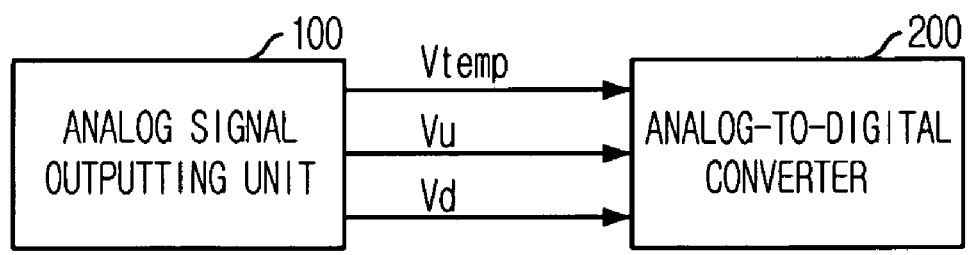
FIG. 2 is a block diagram showing an analog-to-digital converter in accordance with the present invention.

FIG. 2 is a block diagram showing an analog-to-digital converter in accordance with the present invention.

Referring to FIG. 2, the analog-to-digital converter of the present invention receives not only an input voltage vtemp having external analog information but also an upper threshold voltage and a lower threshold voltage for generating the input voltage Vtemp.

Accordingly, the analog-to-digital converter of the present invention has the upper and lower threshold voltages when the input voltage Vtemp is sensed so that the analog-to-digital converter can output a digital value corresponding to exact analog information of the input voltage.

Figure 3:
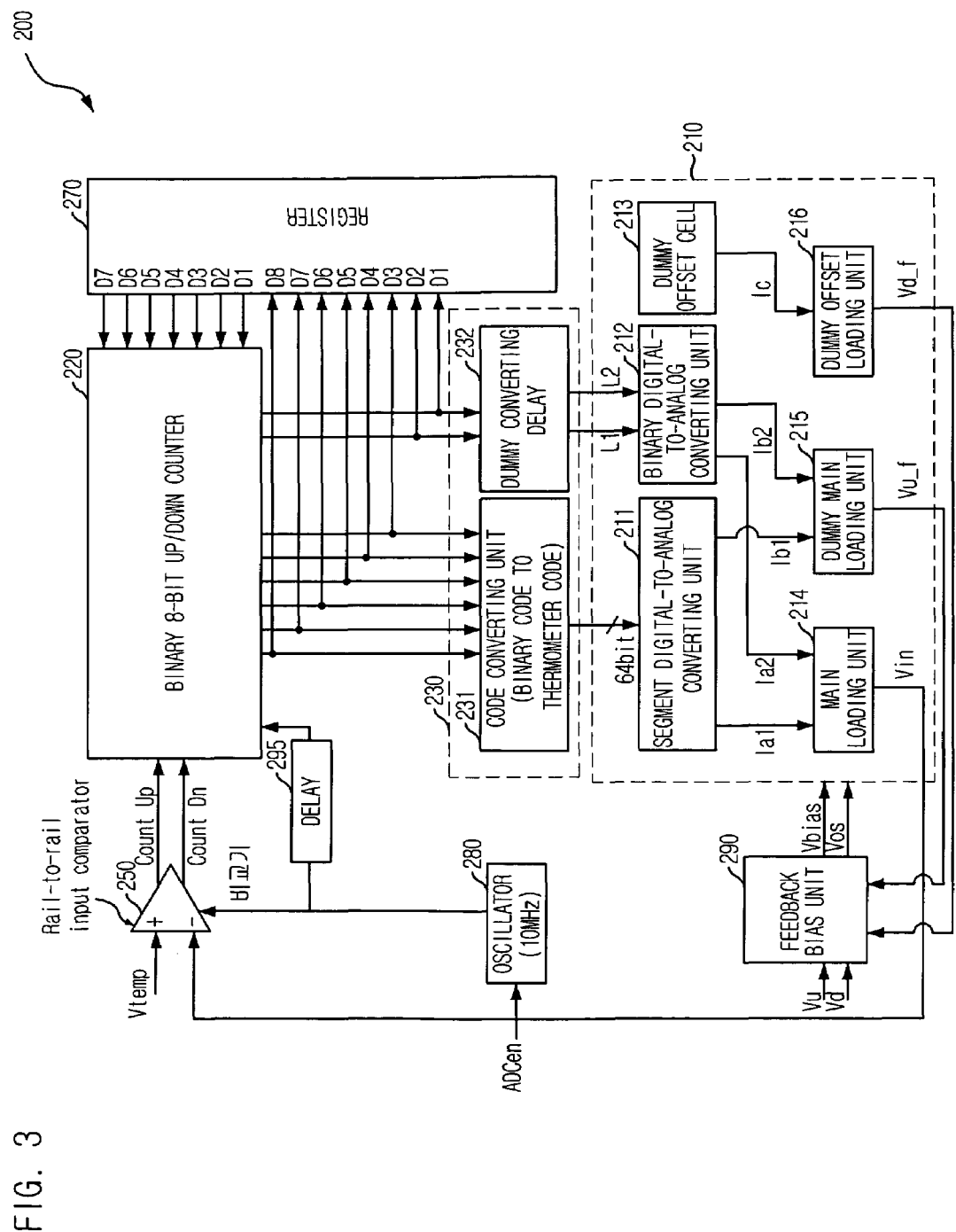
FIG. 3 is a block diagram showing an analog-to-digital converter according to a preferred embodiment.

FIG. 3 is a block diagram showing an analog-to-digital converter according to a preferred embodiment.

Referring to FIG. 3, the analog-to-digital converter 200 includes a voltage comparator 250 for comparing an input voltage Vtemp with a comparison voltage Vin, a binary up/down counter 220 for counting up or down a binary digital code depending on the comparison result from the voltage comparator 250, a digital-to-analog converting unit 210 for converting the binary digital code that is transferred from the up/down counter 220 to the comparison voltage Vin by using a bias voltage Vbias and an offset voltage Vos, and for outputting a feedback upper threshold voltage Vu_f having the voltage level of the comparison voltage Vin when the binary digital code is the maximum and outputting a feedback lower threshold voltage Vd_f having the voltage level of the comparison voltage Vin when the binary digital code is the minimum, and a feedback bias unit 290 for comparing the feedback upper threshold voltage Vu_f with the upper threshold voltage Vu having the maximum level of the input voltage Vtemp to output the bias voltage Vbias and for comparing the feedback lower threshold voltage Vd_f with the lower threshold voltage Vd having the minimum level of the input voltage Vtemp.

Further, the analog-to-digital converter of the present invention includes a code converting unit 230 for converting the code from the binary up/down counter 220 to a thermometer code to output to the digital-to-analog converting unit 210.

Additionally, the code converting unit 230 includes a thermometer code converting unit 231 for converting the binary digital code corresponding to the upper 6 bits of the output of the up/down counter 220 to the thermometer code, and a dummy converting unit 232 for delaying the remaining 2 bits of the digital code that are not converted in the code converting unit 231 while the code converting unit 231 performs conversion.

Moreover, the digital-to-analog converting unit 210 includes a segment digital-to-analog converting unit 211 for converting the thermometer code from the code converting unit 230 to a first analog value Ia1 and for outputting the first analog value Ia1 corresponding to the maximum value of the thermometer code as a first dummy analog value Ib1, a binary digital-to-analog converting unit 212 for converting the binary digital code from the dummy converting unit 240 to a second analog value Ia2 and for outputting the second analog value Ia2 corresponding to the maximum of the binary digital code as a second dummy analog value Ib2, a main loading unit 214 for generating the comparison voltage Vin by using the first and second analog values Ia1, Ia2, a dummy main loading unit 215 for outputting the feedback upper threshold voltage Vu_f by using the first and second dummy analog values Ib1, Ib2, a dummy offset cell 213 for flowing dummy offset current Ic corresponding to the offset voltage Vos, and a dummy offset loading unit 216 for outputting the feedback lower threshold voltage Vd_f by using the dummy offset current Ic.

Here, the first and second analog values Ia1, Ia2 are the current flowing through the main loading unit 214 and the first and second dummy analog values Ib1, Ib2 are the current flowing through the dummy main loading unit 214.

Furthermore, the analog-to-digital converter 200 includes an oscillator 280 for outputting a clock waveform for determining the operation period of the voltage comparator 250. Here, it is assumed that the oscillator 280 is operated at 10 MHz and enabled by an enable signal ADCen from a refresh period controlling unit 300. The analog-to-digital converter 200 can operates only if the enable signal ACDen is inputted to activate the oscillator 280 to input the clock waveform to the voltage comparator 250.

In addition, the analog-to-digital converter 200 includes a delay 295 for delaying the clock waveform from the oscillator 280 by a predetermined time to operate the up/down counter 220 after a predetermined time from the operation of the voltage comparator 250.

Further, the analog-to-digital converter 200 includes a register 270 for latching the digital code from the up/down counter 220.

Figure 4:
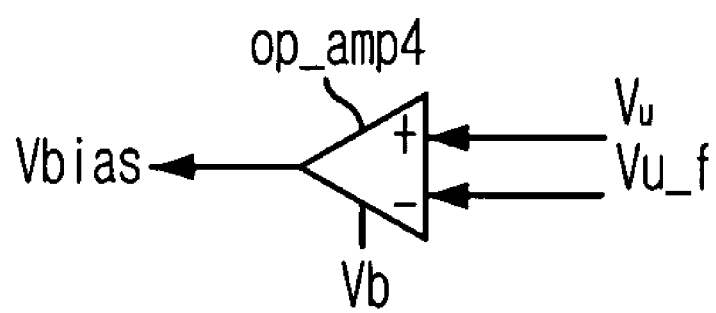
FIG. 4 is a circuit diagram showing a feedback bias unit shown in FIG. 3.
Figure 4:
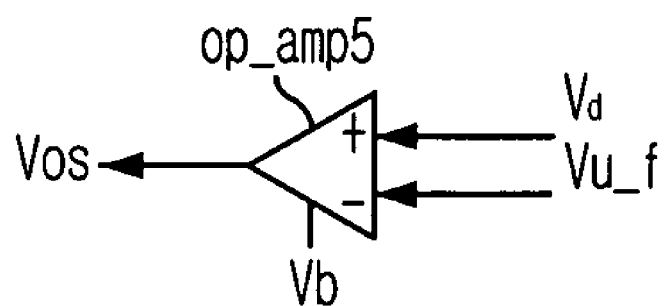

FIG. 4 is a circuit diagram showing a feedback bias unit shown in FIG. 3.

Referring to FIG. 4, the feedback bias unit 290 includes an operational amplifier op_amp4 receiving the upper threshold voltage Vu and the feedback upper threshold voltage Vu_f to output the bias voltage Vbias, and an operational amplifier op_amp5 receiving the lower threshold voltage Vd and the feedback lower threshold Vd_f to output the offset voltage Vos.

Figure 5:
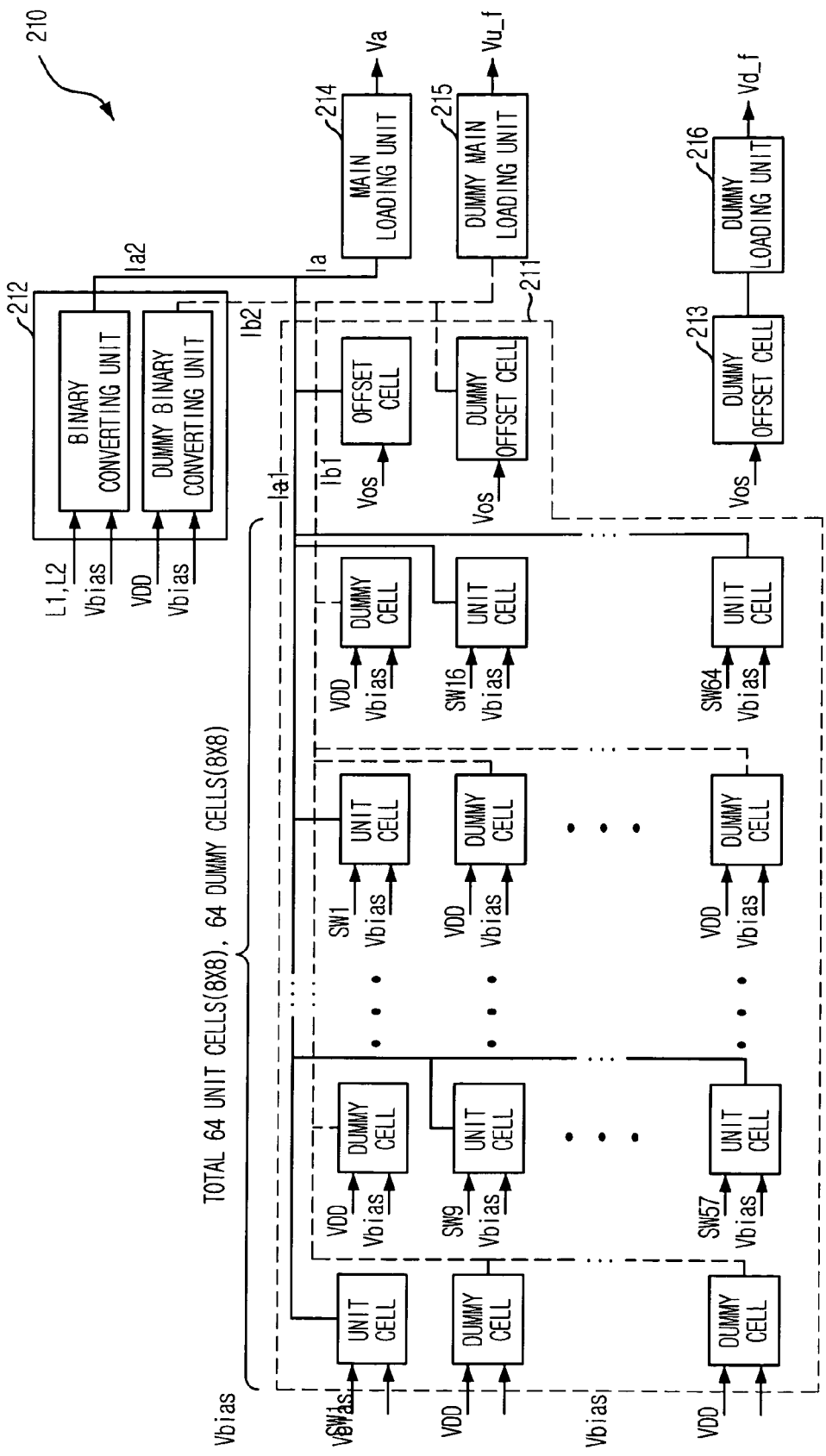
FIG. 5 is a block diagram showing a digital-to-analog converting unit shown in FIG. 3.

FIG. 5 is a block diagram showing a digital-to-analog converting unit shown in FIG. 3.

Referring to FIG. 5, the segment digital-to-analog converting unit 211 includes a plurality of unit cells, each flowing a predetermined amount of current in response to one bit signal of the thermometer code, depending on the bit number of the thermometer code that is outputted from the code converting unit 230, an offset cell for flowing offset current in response to the offset voltage Vos, a plurality of dummy cells, the number of the dummy cells being equal to the number of the unit cells, the dummy cells being arranged alternately with the unit cells for flowing current having the same current amount as the current flowing through the plurality of unit cells, and a second dummy offset cell for flowing dummy offset current having the same current amount as the offset current that flows the offset cell. The sum of the current that flows the plurality of the dummy cells and the second dummy offset cell is outputted as the first dummy analog value.

The binary digital-to-analog converting unit 212 includes a binary converting unit for converting the 2-bit digital signal L0, L1 from the dummy converting unit to the second analog value Ia2, and a dummy binary converting unit for outputting the second analog value Ia2 corresponding to the maximum value of the 2-bit digital signal L0, L1 as the second dummy analog value Ib2.

The main loading unit 214 outputs the comparison voltage Va corresponding to the first and second analog values Ia1, Ia2, and the dummy main loading unit 215 outputs the feedback upper threshold voltage Vu_f corresponding to the first and second dummy analog values Ib1, Ib2.

The dummy loading unit 216 outputs the feedback lower threshold voltage Vd_f corresponding to the current Ic flowing the dummy offset cell 213.

Figure 6A:
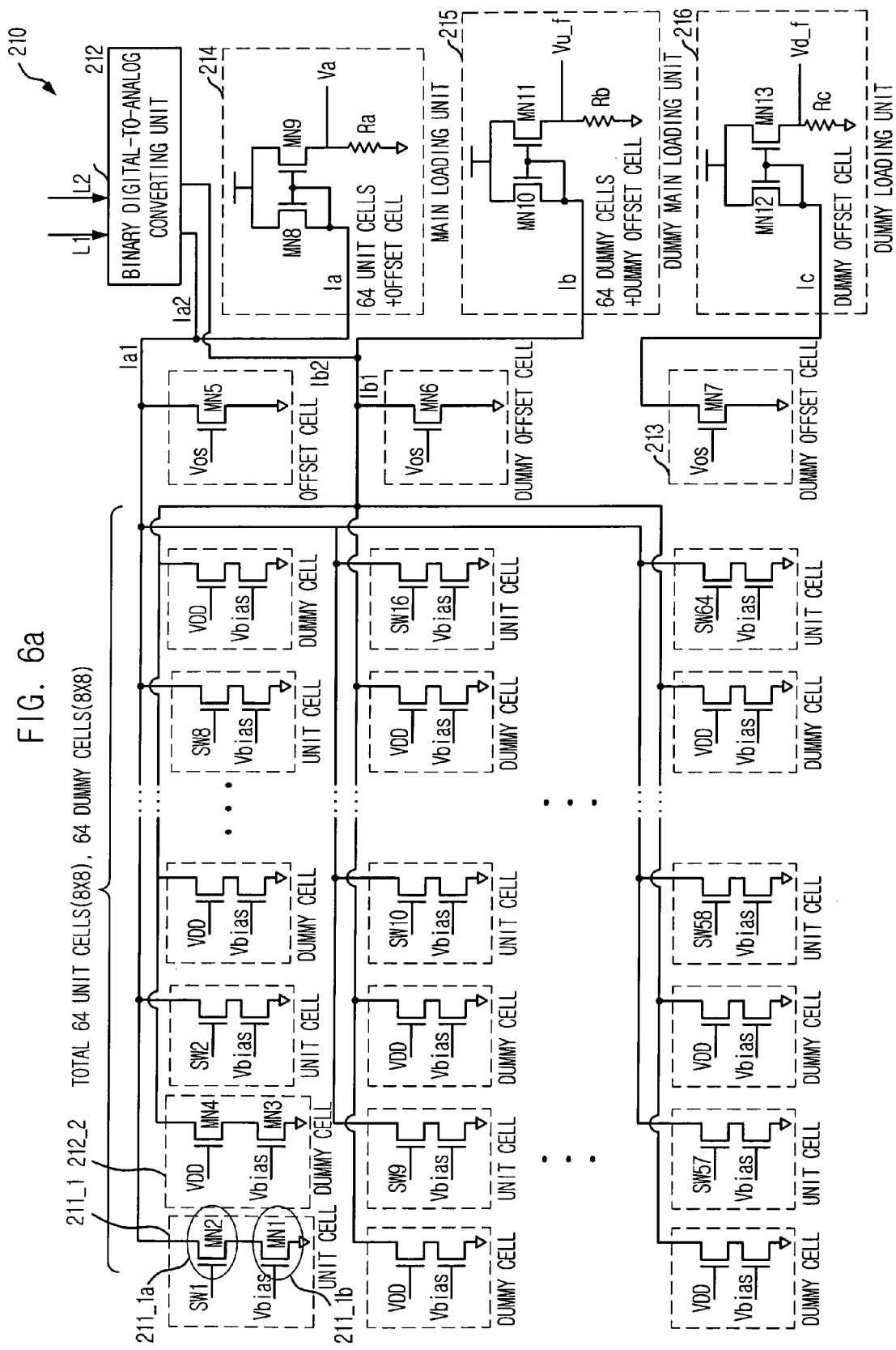
FIGS. 6A and 6B are circuit diagrams showing a digital-to-analog converting unit shown in FIG. 3.
Figure 6B:
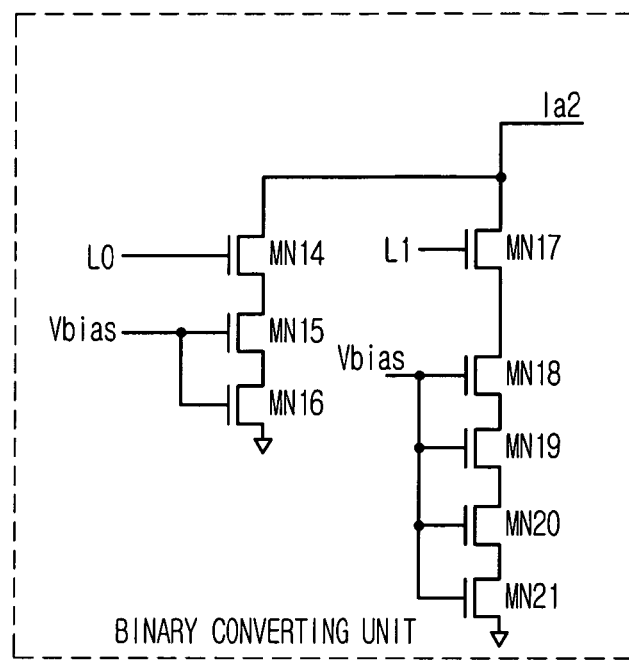

FIGS. 6A and 6B are circuit diagrams showing a digital-to-analog converter shown in FIG. 3.

Referring to FIG. 6A, the unit cell 211 includes a switch 211_1a turned on in response to one bit signal SW1 of the thermometer code, and a current source 211_1b coupled to the switch 211_1a for flowing the current corresponding to the bias voltage Vbias.

The current source 211_1b includes a MOS transistor MN1 having a gate receiving the bias voltage Vbias. The switch 211_1a is formed with a MOS transistor MN2.

The dummy cell 211_2 includes a dummy switch MOS transistor MN4 maintaining turned on state and having a gate coupled to a power voltage VDD, and a dummy current source MOS transistor MN3 serially coupled to the dummy switch MOS transistor MN4 and having a gate receiving the bias voltage Vbias.

The offset cell has an offset MOS transistor MN5 having a gate receiving the offset voltage Vos.

The second dummy offset cell has a dummy offset MOS transistor MN6 having a gate receiving the offset voltage Vos. The dummy offset cell has a dummy offset MOS transistor MN7 having a gate receiving the offset voltage Vos.

The main loading unit 214 includes a diode-coupled MOS transistor MN8 having one end coupled to the power voltage VDD and the other end commonly coupled to the plurality of the unit cells and the offset cell for flowing the first current Ia corresponding to the current amount flowing through the plurality of the unit cells and the offset cell, a MOS transistor MN9 having one end coupled to the power voltage VDD and forming a current mirror with the MOS transistor MN8, and a resistor Ra having one end coupled to the other end of the MOS transistor MN9 and the other end coupled to a ground voltage VSS. The voltage Va corresponding to the first analog value is outputted from the one end of the resistor Ra.

The dummy main loading unit 215 includes a diode-coupled MOS transistor MN10 having one end coupled to the power voltage VDD and the other end commonly coupled to the plurality of the dummy cells and the dummy offset cell to flow the second current Ib corresponding to the current amount flowing through the plurality of the dummy cells and the first dummy offset cell, a MOS transistor MN11 having one end coupled to the power voltage VDD and forming a current mirror with the MOS transistor MN10, and a resistor Rb having one end coupled to the other end of the MOS transistor MN11 and the other end coupled to the ground voltage VSS. The feedback upper threshold voltage Vu_f is outputted from the one end of the resistor Rb.

The dummy loading unit 216 includes a diode-coupled MOS transistor MN12 having one end coupled to the power voltage VDD and the other end coupled to the second dummy offset cell to flow the current Ic corresponding to the current amount flowing through the second dummy offset cell, a MOS transistor MN13 having one end coupled to the power voltage VDD and forming a current mirror with the MOS transistor MN13, and a resistor Rc having one end coupled to the other end of the MOS transistor MN13 and the other end coupled to the ground voltage VSS. The feedback lower threshold voltage Vd_f is outputted from the one end of the resistor Rc.

Referring to FIG. 6B, the binary converting unit includes serially coupled MOS transistors MN15, MN16, each having a gate receiving the bias voltage Vbias, a MOS transistor MN14 serially coupled to the MOS transistor MN15 and having a gate receiving the binary digital signal L0, serially coupled four MOS transistor MN18–MN21, and a MOS transistor MN17 serially coupled to the MOS transistor MN18 and having a gate receiving the binary digital signal L1.

The dummy binary converting unit has the same construction as the binary converting unit except that the dummy binary converting unit receives the power voltage VDD instead of the binary digital signal.

Figure 6B:
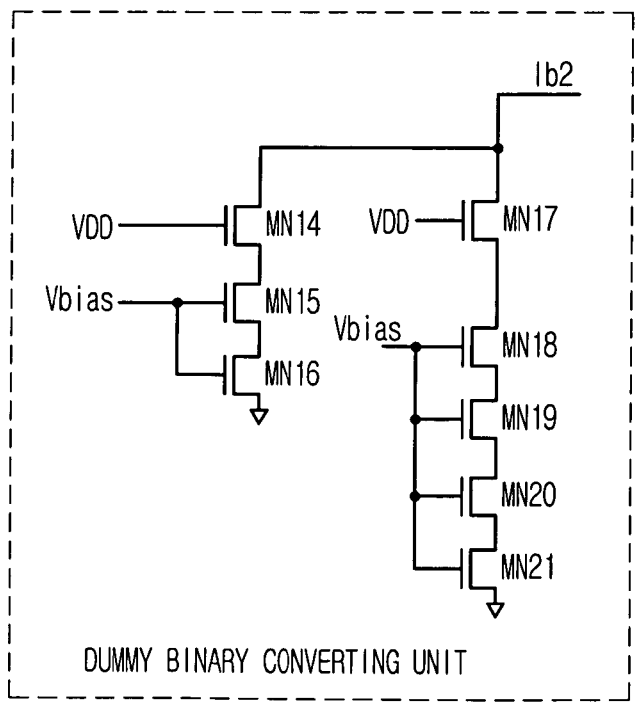
Figure 7:
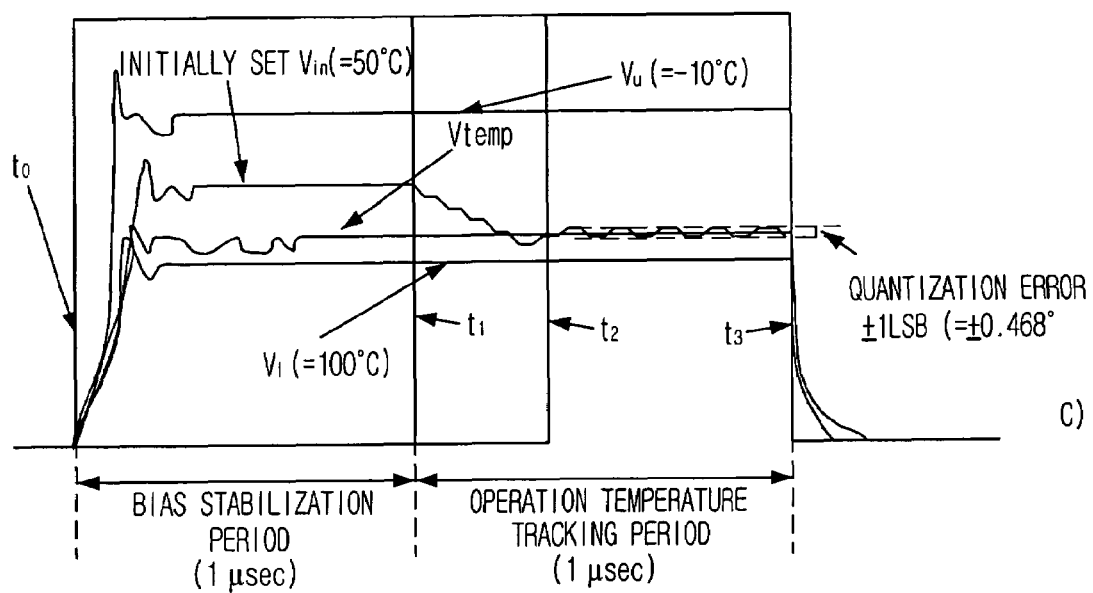
FIG. 7 is a waveform diagram showing an operation of an analog-to-digital converter shown in FIG. 3.

FIG. 7 is a waveform diagram showing operations of an analog-to-digital converter shown in FIG. 3. It will be described in detail for the operations of the analog-to-digital converter of the present invention with reference to FIGS. 5 to 7.

First, the voltage comparator 250 compares the input voltage Vtemp from the temperature sensor 100 with the comparison voltage Vin to output a count-up signal or a count-down signal. The used voltage comparator 250 is a comparator in the form of a rail-to-rail input comparator capable of comparing all the levels from the ground voltage to the power voltage. The input voltage Vtemp has its level corresponding to current temperature and the comparison voltage Vin has its level corresponding to an initial set value in the initial operation and has its level depending on temperature corresponding to the refresh operations period in the refresh operation.

When the analog-to-digital converter 200 initiates its operation, the comparison voltage Vin corresponding to the initial set digital code is inputted to the voltage comparator 250. After one refresh period adjustment, the comparison voltage Vin corresponding to the binary digital code (corresponding to previous operation temperature) that is stored in the register 270 is inputted to the voltage comparator 250.

Subsequently, the up/down counter 220 receives the count-up signal CountUp or the count-down signal Count-Down from the voltage comparator 250 to count up or down the 8-bit binary digital code.

Then, the code converting unit 230 converts the upper 6 bits of the 8-bit digital code from the up/down counter 220 to the thermometer code and the dummy converting unit 240 delays the lower 2 bits until the conversion of the code converting unit 230 is completed.

Table 1 shows an example of the thermometer code. Referring to Table 1, when the 6-bit binary digital code is converted to the thermometer code, a signal having total 64 bits is needed.

Accordingly, many bits of the code should be processed when the digital code is converted into the analog value by using the thermometer code, which leads a complex circuit to make it complicated to implement the circuit. However, since the thermometer code increases one by one with increase of the digital code, monolithic feature can be ensured in conversion to the analog value with using the thermometer code than direct conversion to the analog value with using the binary digital code, and there is little glitch in conversion. Further, the switches that are included within the digital-to-analog converting unit may be designed to have same size.

The analog-to-digital converter of the present embodiment employs a hybrid scheme for converting a predetermined number of upper bits (6 bits) to the thermometer code and finally to the analog value, and converting the remaining lower bits (2 bits) directly to the analog value, in order to prevent the circuit from being complicated depending on the number of bits that is increased in thermometer code conversion.

With such a hybrid scheme, the analog-to-digital converter minimizes the glitch in the code conversion and improves bandwidth. In other words, it may obtain benefit of conversion with the thermometer code and benefit of direct conversion with the binary digital code.

Continuously, the segment digital analog converting unit 211 outputs the current Ia1 having the first analog value corresponding to the 64 bit thermometer code and the binary digital-to-analog converting unit 212 outputs the current having the second analog value corresponding to the 2-bit digital code from the dummy converting unit 240.

The main loading unit 214 outputs the comparison voltage Vin corresponding to the sum of the current Ia1 having the first analog value and the current Ia2 having the second analog value to the voltage comparator 250.

The voltage comparator 250 compares the input voltage Vtemp with the comparison voltage Vin to output the count-up signal CountUp and the count-down signal Count-Down and the up/down counter 220 to count up or down the digital code with this signal.

The above procedure is repeated until both of the voltages Vtemp, Vin that are inputted to the voltage comparator 250 become equal to each other. When the comparison voltage Vin is equal to the input voltage Vtemp, the digital code that is outputted from the up/down counter 220 is used as information for adjusting the refresh period. On the other hand, whenever there is output change in the output of the up/down counter 220, the register 270 latches the output of the up/down counter 220.

Continuously, it will be described for the operation of the digital-to-analog converting unit 210.

The segment digital-to-analog converting unit 211 includes 64 unit cells for receiving respective 64 bits of the thermometer code to flow the predetermined current. The offset cell receives the offset voltage Vos from the temperature sensing unit 100 to flow the offset current.

The main loading unit 214 outputs the voltage Va corresponding to the summed current Ia of the currents flowing through the unit cells that are turned on by the 64 bits of the thermometer code and the offset current Ios flowing through the offset cell.

Further, the segment digital-to-analog converting unit 211 includes 64 dummy cells that are always turned on and arranged to surround each of the 64 unit cells in common centroid pattern to flow the current corresponding to the current that flows when all the 64 unit cells are turned on. The second dummy offset cell flows the current having the same amount as the offset current flowing through the offset cell. The dummy cells arranged alternately with the unit cells in common centroid pattern go through substantially same process as the unit cells so that the dummy cells can flow the same current as the unit cells regardless of process variation.

The dummy main loading unit 215 outputs the feedback upper threshold voltage Vu_f corresponding to a current Ib flowing through the 64 dummy cells that are always turned on and the second dummy offset cell.

That is, the feedback upper threshold voltage Vu_f has the same voltage level as the voltage Va that is outputted from the main loading unit 214 when all the 64 unit cells are turned on when all the 64 bits of the thermometer code from the code converting unit 230 are all high. Accordingly, the feedback upper threshold voltage vu_f is outputted to the feedback bias unit 290 as representing the voltage when the digital code from the analog-to-digital converter 200 is the maximum.

The feedback bias unit 290 receives the feedback upper threshold Voltage Vu_f and the upper threshold voltage Vu to correct the bias voltage Vbias.

The dummy offset cell 213 flows the current having the same amount as the offset cell and the dummy loading unit outputs the feedback lower threshold voltage Vd_f corresponding to the current flowing through the dummy offset cell to the feedback bias unit 290.

Consequently, the feedback lower threshold voltage Vd_f has the same voltage level as the voltage Va that is outputted from the main loading unit 214 when the current flows through no unit cell but the offset cell when all the 64 bits of the thermometer code are all low.

Accordingly, the feedback lower threshold voltage Vd_f is outputted to the feedback bias unit 290 as representing the voltage when the digital code from the analog-to-digital converter 200 is the minimum. The feedback bias unit 290 receives the feedback lower threshold voltage Vd_f to correct the offset voltage Vos.

As described above, the analog-to-digital converter 200 of the present embodiment converts the input voltage Vtemp to the digital code using the bias voltage Vbias and the offset voltage Vos that are outputted from the feedback bias unit 290.

Further, the feedback bias unit 290 corrects the bias voltage Vbias and the offset voltage Vos by using the feedback upper threshold voltage Vu_f and the feedback lower threshold voltage Vd_f that are outputted from the digital-to-analog converting unit 210.

From this, the analog-to-digital converter of the present embodiment determines the bias voltage and the offset voltage by using the upper threshold voltage and the lower threshold voltage of the input voltage Vtemp so as to convert the analog value to the digital value without variation, even if the level of the input voltage Vtemp varies due to process or driving voltage variation with having same analog information.

By using such a digital code as obtained above within the semiconductor device, reliable operations can be achieved without regard to process or driving voltage variation.

Referring continuously to FIG. 7, when the enable signal ADDen is inputted as activated, the oscillator 280 operates to initiate the operation of the voltage comparator 250 and the up/down counter 230.

Then, the upper threshold voltage Vu and the lower threshold voltage Vd are inputted to output the bias voltage and the offset voltage at t0. Then, the inputted input voltage Vtemp is compared with the initially set comparison voltage Vin at t1.

The analog-to-digital converter 200 repetitively compares the input voltage Vtemp with the comparison voltage Vin as adjusting the level of the comparison voltage Vin.

When the input voltage Vtemp is equal to the comparison voltage Vin, the comparison is stopped at t2. The digital value that is latched at t2 represents accurately the analog information in the input voltage Vtemp. Then, the enable signal ADDen goes to deactivated state at t3 to stop the operation of the oscillator.

The analog-to-digital converter of the present invention receives the upper threshold voltage and the lower threshold voltage that are used to generate the analog value along with the analog value to use as the bias voltage and the offset voltage so that the digital value corresponding to the inputted analog value can be obtained stably and reliably without regard to process or driving voltage variation.

The present application contains subject matter related to the Korean patent application No. KR 2004-11134, filled in the Korean Patent Office on Feb. 19, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An analog-to-digital converter for use in a semiconductor device, comprising:
   a voltage comparing means for comparing an input voltage with a comparison voltage;
   a binary up/down counting means for up/down converting an outputted binary digital code based on the comparison result of the voltage comparing means;
   a digital-to-analog converting means for converting the binary digital code of the up/down counting means as the comparison voltage by using a bias voltage and an offset voltage, and for outputting a feedback upper threshold voltage and a feedback lower threshold voltage; and
   a feedback bias means for comparing the feedback upper threshold voltage with an upper threshold voltage having the maximum level of the input voltage to output the bias voltage and comparing the feedback lower threshold voltage with a lower threshold voltage having the minimum level of the input voltage to output the offset voltage.

2. The analog-to-digital converter as recited in claim 1, wherein the feedback bias means includes:
   a first operational amplifier for receiving the upper threshold voltage and the feedback upper threshold voltage to output the bias voltage; and
   a second operational amplifier for receiving the lower threshold voltage and the feedback lower threshold voltage to output the offset voltage.

3. The analog-to-digital converter as recited in claim 1, further comprising a code converting means for converting the code from the binary up/down counting means to a thermometer code to output to the digital-to-analog converting means.

4. The analog-to-digital converter as recited in claim 3, wherein the code converting means includes:
   a thermometer code converting means for converting the binary digital code corresponding to a predetermined number of the upper bits of the output from the up/down counting means to the thermometer code; and
   a dummy converting means for delaying the remaining part of the binary digital code that are not converted in the code converting means while the thermometer code converting means performs the code conversion.

5. The analog-to-digital converter as recited in claim 4, wherein the digital-to-analog converting means includes:
   a segment digital-to-analog converter for converting the thermometer code that is converted in the thermometer code converting means to a first analog value and outputting the first analog value when the thermometer code is the maximum as a first dummy analog value;
   a binary digital-to-analog converting means for converting the binary digital code from the dummy converting means to a second analog value and outputting the second analog value when the binary digital code is the maximum as a second dummy analog value;
   a main loading means for generating the comparison voltage by using the first and second analog values;
   a dummy main loading means for outputting the feedback upper threshold voltage by using the first and second dummy analog values;
   a first dummy offset cell for flowing dummy offset current corresponding to the offset voltage; and
   a dummy offset loading means for outputting the feedback lower threshold voltage by using the dummy offset current.

6. The analog-to-digital converter as recited in claim 5, wherein the segment digital-to-analog converting means includes:
   a plurality of unit cells, each for flowing a predetermined amount of current in response to one bit signal of the thermometer code, depending on the bit number of the thermometer code;
   an offset cell for flowing the offset current in response to the offset voltage;
   a plurality of dummy cells, the number of the dummy cells being equal to the number of the unit cells, the dummy cells being arranged alternately with the unit cells for flowing current having the same current amount as flowing through the plurality of unit cells; and a second dummy offset cell for flowing dummy offset current having the same current amount as the offset current that flows the offset cell, the sum of the current that flows through the plurality of the dummy cells and the current that flow through second dummy offset cell being outputted as the first dummy analog value.

7. The analog-to-digital converter as recited in claim 6, wherein the unit cell includes:
   a switch turned on in response to one bit signal of the thermometer code; and
   a current source coupled to the switch for flowing the current having the amount corresponding to the bias voltage.

8. The analog-to-digital converter as recited in claim 7, wherein the switch includes a MOS transistor.

9. The analog-to-digital converter as recited in claim 8, wherein the current source includes a MOS transistor having a gate receiving the bias voltage.

10. The analog-to-digital converter as recited in claim 9, wherein the dummy cell includes:
    a dummy switch MOS transistor maintained turned on always; and
    a dummy current source MOS transistor serially coupled to the dummy switch MOS transistor and having a gate receiving the bias voltage.

11. The analog-to-digital converter as recited in claim 10, wherein the offset cell includes an offset MOS transistor having a gate receiving the offset voltage.

12. The analog-to-digital converter as recited in claim 11, wherein the first dummy offset cell includes a first dummy offset MOS transistor having a gate receiving the offset voltage.

13. The analog-to-digital converter as recited in claim 12, wherein the second dummy offset cell includes a second dummy offset MOS transistor having a gate receiving the offset voltage.

14. The analog-to-digital converter as recited in claim 13, wherein the main loading means includes:
    a first diode-coupled MOS transistor having one end coupled to a power voltage and the other end commonly coupled to the plurality of unit cells and the offset cell to flow current corresponding to the current amount that flows through the plurality of unit cells and the offset cell;
    a second MOS transistor having one end coupled to the power voltage for forming a current mirror with the first MOS transistor; and
    a first resistor having one end coupled to the other end of the second MOS transistor and the other end coupled to a ground voltage,
    the voltage corresponding to the first analog value being outputted from the one end of the resistor.

15. The analog-to-digital converter as recited in claim 14, wherein the dummy main loading means includes:
    a third diode-coupled MOS transistor having one end coupled to the power voltage and the other end commonly coupled to the plurality of the dummy cells and the dummy offset cell to flow the current corresponding to the current amount flowing through the plurality of dummy cells and the first dummy offset cell;
    a fourth transistor having one end coupled to the power voltage for forming a current mirror with the third MOS transistor; and
    a second resistor having one end coupled to the other end of the fourth transistor and the other end coupled to the ground voltage,
    the feedback upper threshold voltage being outputted from the one end of the second resistor.

16. The analog-to-digital converter as recited in claim 15, wherein the dummy loading means includes:
    a fifth MOS transistor having one end coupled to the power voltage and the other end coupled to the second dummy offset cell to flow the current corresponding to the current amount flowing through the dummy offset cell;
    a sixth MOS transistor having one end coupled the power voltage for forming a current mirror with the fifth MOS transistor; and
    a third resistor having one end coupled to the other end of the sixth MOS transistor and the other end coupled to the ground voltage,
    the feedback lower threshold voltage being outputted from the one end of the third resistor.

17. The analog-to-digital converter as recited in claim 16, further comprising an oscillator for outputting a clock waveform to determine the operation period of the voltage comparing means.

18. The analog-to-digital converter as recited in claim 17, further comprising a delay for delaying the clock waveform of the oscillator by a predetermined time so that the up/down counting means can operates after a predetermined time from the operation of the voltage comparing means.

19. The analog-to-digital converter as recited in claim 18, further comprising a register for latching the digital code from the up/down counting means.

20. The analog-to digital converter as recited in claim 1, wherein the digital-to-analog converting means outputs the feedback upper threshold voltage having the voltage level of the comparison voltage when the binary digital code is the maximum value and the feedback lower threshold voltage having the voltage level of the comparison voltage when the binary digital code is the minimum value.

* * * * *